(12) United States Patent
Kagawa

(10) Patent No.: US 8,598,470 B2
(45) Date of Patent: Dec. 3, 2013

(54) ELECTROMAGNETIC-WAVE-ABSORBING FILM AND ELECTROMAGNETIC WAVE ABSORBER COMPRISING IT

(76) Inventor: Seiji Kagawa, Koshigaya (JP)

(*) Notice: Subject to any disclaimer, the term of this patent is extended or adjusted under 35 U.S.C. 154(b) by 568 days.

(21) Appl. No.: 12/936,362

(22) PCT Filed: Jun. 26, 2009

(86) PCT No.: PCT/JP2009/061728
§ 371 (c)(1),
(2), (4) Date: Oct. 4, 2010

(87) PCT Pub. No.: WO2009/157544
PCT Pub. Date: Dec. 30, 2009

(65) Prior Publication Data
US 2011/0031008 A1  Feb. 10, 2011

(30) Foreign Application Priority Data

Jun. 26, 2008 (JP) .................................. 2008-167855
Aug. 1, 2008 (JP) .................................. 2008-200252

(51) Int. Cl.
*H05K 9/00* (2006.01)
(52) U.S. Cl.
USPC ............................... 174/386; 174/388; 342/4
(58) Field of Classification Search
USPC ........ 174/382, 383, 384, 388, 386; 361/818; 428/116, 137; 342/4
See application file for complete search history.

(56) References Cited

U.S. PATENT DOCUMENTS

| | | | |
|---|---|---|---|
| 7,749,620 B2 | 7/2010 | Yoshida et al. | |
| 2003/0223213 A1* | 12/2003 | Daoud et al. | 361/818 |
| 2005/0233102 A1 | 10/2005 | Kagawa et al. | |
| 2006/0115636 A1 | 6/2006 | Yoshida et al. | |
| 2006/0246261 A1* | 11/2006 | Kasabo et al. | 428/182 |
| 2007/0241962 A1* | 10/2007 | Shinoda et al. | 342/361 |
| 2009/0284404 A1* | 11/2009 | Sim et al. | 342/1 |
| 2010/0067210 A1* | 3/2010 | Sato et al. | 361/818 |

FOREIGN PATENT DOCUMENTS

| | | |
|---|---|---|
| CN | 1668783 A | 9/2005 |
| JP | 7-283578 A | 10/1995 |
| JP | 9-148782 A | 6/1997 |
| JP | 11-40980 A | 2/1999 |
| JP | 2002-33592 A | 1/2002 |
| JP | 2002-314284 A | 10/2002 |
| JP | 2004-281632 A | 10/2004 |
| WO | WO 03/091003 A1 | 11/2003 |
| WO | WO 2005-12031 A | 1/2005 |
| WO | WO 2008/075746 A1 | 6/2008 |

OTHER PUBLICATIONS

Machined translation of JP 2002-033592, dated Apr. 21, 2013, claims and detailed description, 7 pages.*
International Search Report dated Aug. 25, 2009 in International Application No. PCT/JP2009/061728.
Chinese Office Action for corresponding Application No. 200980122381.8 dated Mar. 11, 2013 (with English translation).
Notice of Reasons for Rejection dated Jun. 5, 2012 for Japanese Application No. 2010-518077 with English translation.

* cited by examiner

*Primary Examiner* — Hung Ngo
(74) *Attorney, Agent, or Firm* — Birch, Stewart, Kolasch & Birch, LLP

(57) ABSTRACT

An electromagnetic-wave-absorbing film comprising a plastic film, and a single- or multi-layer, thin metal film formed on at least one surface of the plastic film, the thin metal film being provided with large numbers of substantially parallel, intermittent, linear scratches with irregular widths and intervals.

9 Claims, 13 Drawing Sheets

ELECTROMAGNETIC-WAVE-ABSORBING FILM AND ELECTROMAGNETIC WAVE ABSORBER COMPRISING IT

FIELD OF THE INVENTION

The present invention relates to an inexpensive, electromagnetic-wave-absorbing film having excellent electromagnetic wave absorbability in a wide frequency range, and an electromagnetic wave absorber comprising it.

BACKGROUND OF THE INVENTION

Shields for preventing the leak and intrusion of electromagnetic waves are used in electronic and communications apparatuses such as cell phones, personal computers, etc. Shields widely used at present are metal sheets or nets, etc., but they are heavy and bulky, and not easy to be disposed in apparatus casings. As a light-weight, electromagnetic-wave-absorbing shield, which can be easily disposed in plastic casings, etc., JP 9-148782 A proposes a shield comprises a first aluminum film vapor-deposited on one surface of a plastic film and etched to have a non-conductive linear pattern, and a second aluminum film vapor-deposited on the other surface of the plastic film and etched to have a network pattern. However, the linear patterns and the network patterns illustrated in this reference are all periodic, absorbing only electromagnetic waves in particular frequencies, but failing to absorb electromagnetic waves in a wide frequency range without leak. In addition, because the patterns are obtained by etching, this electromagnetic-wave-absorbing shield is inevitably expensive.

JP 11-40980 A proposes an electromagnetic wave shield having a copper layer and a nickel layer both vapor-deposited on one surface of a plastic film. However, this electromagnetic wave shield does not have linear gaps in the vapor-deposited layer, exhibiting low electromagnetic wave absorbability.

OBJECT OF THE INVENTION

Accordingly, an object of the present invention is to provide an inexpensive, electromagnetic-wave-absorbing film having excellent electromagnetic wave absorbability in a wide frequency range, and an electromagnetic wave absorber comprising it.

DISCLOSURE OF THE INVENTION

As a result of intensive research in view of the above object, the inventor has found that when a single- or multi-layer, thin metal film formed on a plastic film are provided with large numbers of linear scratches with irregular widths and intervals, an electromagnetic-wave-absorbing film having excellent absorbability to electromagnetic waves in a wide frequency range can be obtained. The present invention has been completed based on such finding.

Thus, the electromagnetic-wave-absorbing film of the present invention comprises a plastic film, and a single- or multi-layer, thin metal film formed on at least one surface of the plastic film, the thin metal film being provided with large numbers of substantially parallel, intermittent, linear scratches with irregular widths and intervals. The thin metal film is preferably made of aluminum, copper, nickel or their alloys.

The linear scratches preferably have widths, 90% or more of which are in a range of 0.1-1,000 µm, and an average width of 1-100 µm. The linear scratches preferably have intervals in a range of 0.1 µm to 5 mm, and an average interval of 1-100 µm. The thin metal film may further have large numbers of fine pores.

The first electromagnetic wave absorber of the present invention comprises pluralities of electromagnetic-wave-absorbing films, each of which comprises a plastic film and a single- or multi-layer, thin metal film formed on at least one surface of the plastic film, the thin metal film being provided with large numbers of substantially parallel, intermittent, linear scratches with irregular widths and intervals, and pluralities of the electromagnetic-wave-absorbing films being arranged such that their linear scratches are oriented in different directions. Pluralities of electromagnetic-wave-absorbing films may have the same or different thin metal films.

In a preferred example of the first electromagnetic wave absorbers, pluralities of flat electromagnetic-wave-absorbing films are laminated directly or via a dielectric layer. The dielectric layer may be an air layer.

In another preferred example of the first electromagnetic wave absorbers, at least one of plural electromagnetic-wave-absorbing films is a corrugated electromagnetic-wave-absorbing film. The corrugation may be constituted by sinusoids, continuously connected arches, continuously connected U shapes, etc. The corrugated electromagnetic-wave-absorbing films may be combined to form a honeycomb structure. When at least one flat electromagnetic-wave-absorbing film is combined with at least one corrugated electromagnetic-wave-absorbing film, the linear scratches of the corrugated electromagnetic-wave-absorbing film may be parallel or perpendicular to those of the flat electromagnetic-wave-absorbing film.

The electromagnetic wave absorber according to a further preferred embodiment of the present invention comprises a pair of outermost, flat, electromagnetic-wave-absorbing film, and at least one corrugated electromagnetic-wave-absorbing film sandwiched by the flat electromagnetic-wave-absorbing films, adjacent electromagnetic-wave-absorbing films being arranged such that their linear scratches are substantially perpendicular to each other, and that their contact areas are bonded to each other, thereby having reduced anisotropy of electromagnetic wave absorbability and self-supportability.

The second electromagnetic wave absorber of the present invention comprises at least one electromagnetic-wave-absorbing film and an electromagnetic wave reflector arranged via a dielectric layer, the electromagnetic-wave-absorbing film comprising a plastic film and a single- or multi-layer, thin metal film formed on at least one surface of the plastic film, and the thin metal film being provided with large numbers of substantially parallel, intermittent, linear scratches with irregular widths and intervals. The electromagnetic wave reflector layer is preferably a metal foil or a plastic film having a thin metal film. The thickness of the dielectric layer is preferably in a range including ¼ of a center wavelength λ of electromagnetic waves to be absorbed, for instance, in a range from λ/8 to λ/2.

DESCRIPTION OF THE BEST MODE OF THE INVENTION

The embodiments of the present invention will be explained referring to the attached drawings, and it should be noted that explanation concerning one embodiment is applicable to other embodiments unless otherwise mentioned. Also, the following explanation is not restrictive, and various modifications may be made within the scope of the present invention.

[1] Electromagnetic-Wave-Absorbing Film

The electromagnetic-wave-absorbing film of the present invention has a single- or multi-layer, thin metal film on at least one surface of a plastic film. The multi-layer thin metal film is preferably a two-layer thin metal film, and in that case, a combination of a thin, magnetic metal film and a thin, non-magnetic metal film is preferable.

(1) First Electromagnetic-Wave-Absorbing Film

FIGS. 1(a) to 1(d) show one example of the first electromagnetic-wave-absorbing films having a single-layer, thin metal film 11 formed on an entire surface of a plastic film 10. Large numbers of substantially parallel, intermittent, linear scratches 12 are formed with irregular widths and intervals on a thin metal film 11.

(a) Plastic Film

Resins forming the plastic film 10 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. The thickness of the plastic film 10 may be about 10-100 µm.

(b) Thin Metal Film

Metals forming the thin metal film 11 are not particularly restrictive as long as they have conductivity, and they are preferably aluminum, copper, nickel, cobalt, silver and their alloys, particularly aluminum, copper, nickel and their alloys from the aspect of corrosion resistance and cost. The thickness of the thin metal film is preferably 0.01 µm or more. Though not restrictive, the upper limit of the thickness may be practically about 10 µm. Of course, the thin metal film may be thicker than 10 µm, with substantially no change in the absorbability of high-frequency electromagnetic waves. The thickness of the thin metal film is more preferably 0.01-5 µm, most preferably 0.01-1 µm, particularly 10-100 nm.

(c) Linear Scratches

Figure 1A:
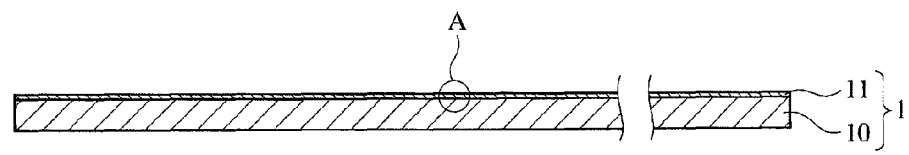
FIG. 1(a) is a cross-sectional view showing an electromagnetic-wave-absorbing film according to one embodiment of the present invention.
Figure 1B:
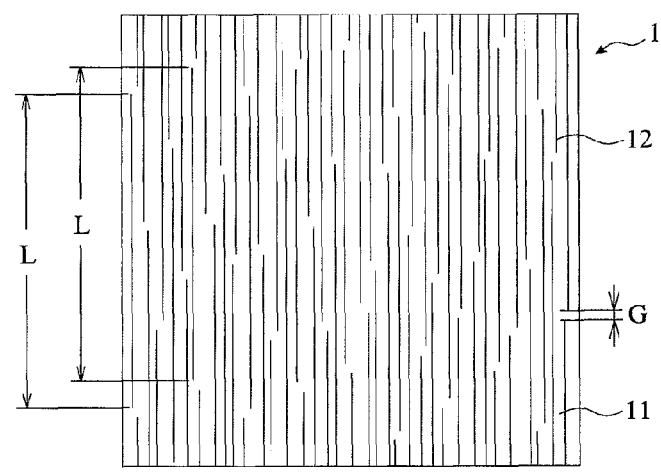
FIG. 1(b) is a partial, enlarged cross-sectional view showing the details of the electromagnetic-wave-absorbing film of FIG. 1(a).
Figure 1C:
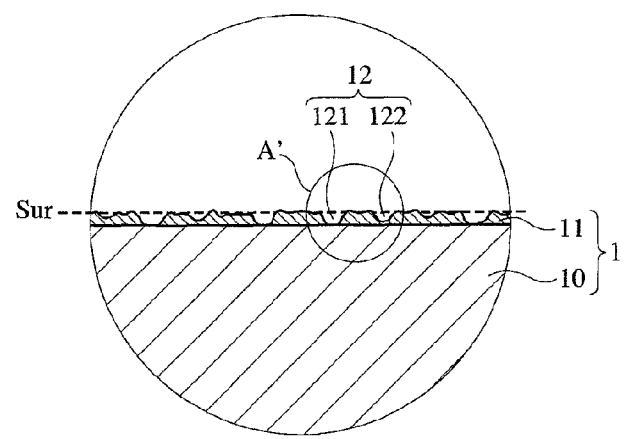
FIG. 1(c) is an enlarged cross-sectional view showing a portion A in FIG. 1(a).
Figure 1D:
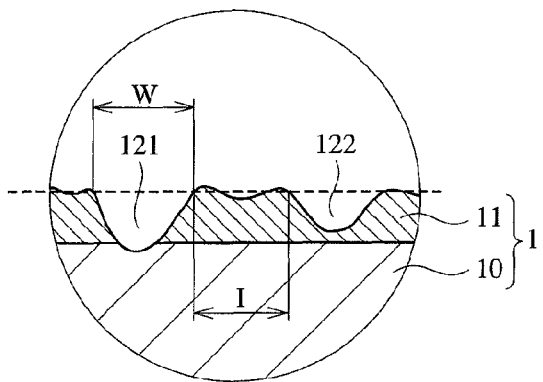
FIG. 1(d) is an enlarged cross-sectional view showing a portion A' in FIG. 1(c).

As is clear from FIGS. 1(b) and 1(c) schematically showing a photomicrograph, the thin metal film 11 is provided with large numbers of substantially parallel, intermittent, linear scratches 12 with irregular widths and intervals. The depth of the linear scratches 12 is exaggerated than actual one for the purpose of explanation. The linear scratches 12 have various widths W, ranging from extremely thin linear scratches to extremely thick linear scratches, and arranged irregularly with various intervals I. The widths W of the linear scratches 12 are measured at a height crossing the original surface Sur, and the intervals I of adjacent linear scratches 12 are measured at a height crossing the original surface Sur. Some of the linear scratches 12 may be partially connected. Also, there are linear scratches 12 penetrating the thin metal film 11 to the plastic film 10 (forming non-conductive portions 121), and linear scratches 12 that are relatively deep but do not penetrate the thin metal film 11 (forming high-resistance portions 122). Because the linear scratches 12 are formed with irregular widths W and intervals I, the electromagnetic-wave-absorbing film of the present invention can efficiently absorb electromagnetic waves in a wide frequency range.

The linear scratches 12 preferably have widths W, 90% or more of which are in a range of 0.1-1,000 μm, and an average width of 1-100 μm. Outside the above range, the electromagnetic-wave-absorbing film has low electromagnetic wave absorbability. 90% or more of the widths W of the linear scratches 12 are more preferably in a range of 0.1-100 μm, most preferably in a range of 0.1-20 μm. The average width Way of the linear scratches 12 is preferably 1-100 μm, more preferably 1-20 μm, most preferably 1-10 μm.

The intervals I of the linear scratches 12 are preferably in a range of 0.1 μm to 5 mm, more preferably in a range of 0.1-1,000 μm, most preferably in a range of 0.1-100 μm, particularly in a range of 0.1-20 μm. The average interval Iav of the linear scratches 12 is preferably 1-100 μm, more preferably 1-20 μm, most preferably 1-10 μm.

Because the length L of the linear scratches 12 is determined by sliding contact conditions (mainly the relative peripheral speed of a roll and a film, and the winding angle θ of the film around the roll), most of them are substantially the same (substantially equal to the average length) unless the sliding contact conditions are changed. Though not restrictive, the length of the linear scratches 12 may be practically about 1-100 mm.

(d) Fine Pores

Figure 2A:
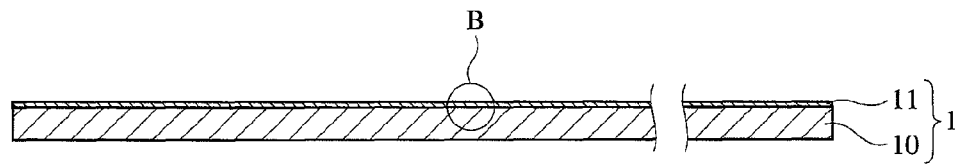
FIG. 2(a) is a cross-sectional view showing an electromagnetic-wave-absorbing film according to another embodiment of the present invention.
Figure 2B:
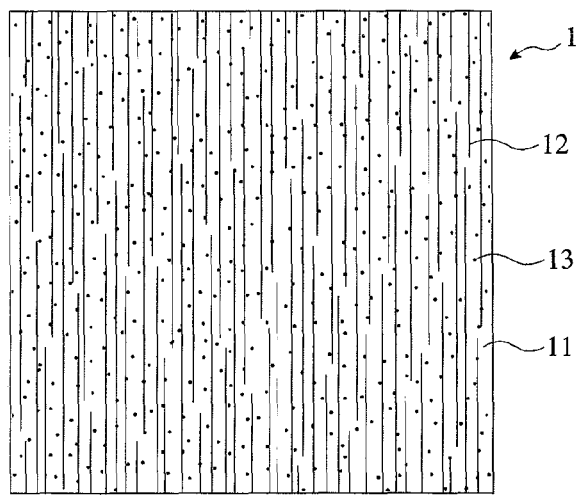
FIG. 2(b) is a partial, enlarged cross-sectional view showing the details of the electromagnetic-wave-absorbing film of FIG. 2(a).
Figure 2C:
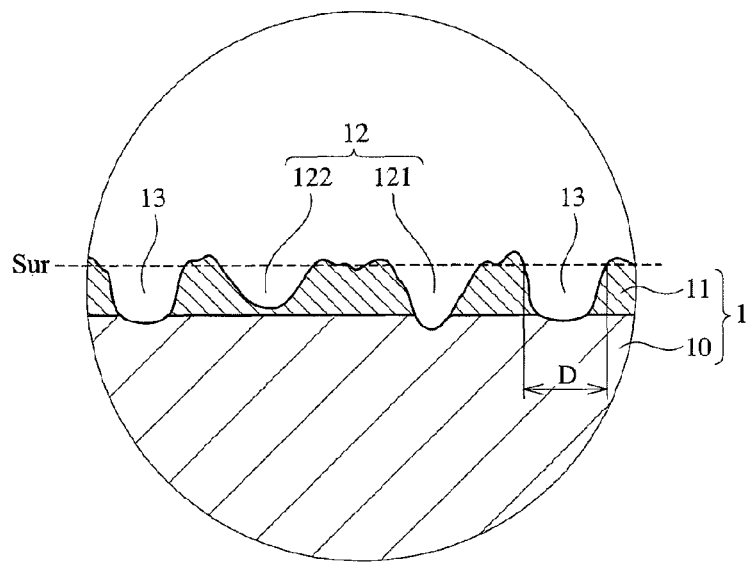
FIG. 2(c) is an enlarged cross-sectional view showing a portion B in FIG. 2(a).

FIGS. 2(a) to 2(c) show another example of the first electromagnetic-wave-absorbing films. In this example, the thin metal film 11 is provided with large numbers of fine pores 13 penetrating the thin metal film 11 at random, in addition to the linear scratches 12. The fine pores 13 can be formed by pressing a roll having fine, high-hardness particles on the surface onto the thin metal film 11. As shown in FIG. 2(c), the opening diameters D of the fine pores 13 are measured at height corresponding to the original surface Sur. 90% or more of the opening diameters D of the fine pores 13 are preferably in a range of 0.1-1,000 μm, more preferably in a range of 0.1-500 μm. The average opening diameter Day of the fine pores 13 is preferably in a range of 0.5-100 μm, more preferably in a range of 1-50 μm. The upper limit of the average opening diameter Day is further preferably 20 μm, most preferably 10 μm. The average density of the fine pores 13 is preferably 500/cm$^2$ or more, more preferably $1\times10^4$/cm$^2$ to $3\times10^5$/cm$^2$.

(e) Protective Layer

Figure 3:
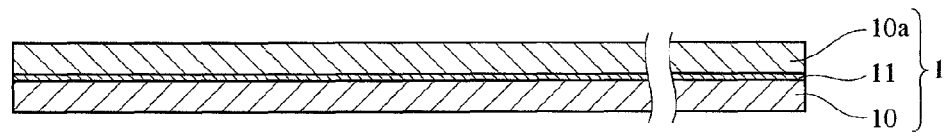
FIG. 3 is a cross-sectional view showing an electromagnetic-wave-absorbing film according to a further embodiment of the present invention.

As shown in FIG. 3, a protective plastic layer 10a for covering the linear scratches 12 (and fine pores 13) may be formed on the thin metal film 11. The protective layer 10a is preferably as thick as 10-100 μm.

(f) Embossing

To improve electromagnetic wave absorbability, the electromagnetic-wave-absorbing film may be provided with large numbers of conical or spherical embosses. The diameters and depths of the embosses are preferably 100 μm or more, more preferably 150-250 μm. The area ratio of the embosses is preferably 20-60%.

(g) Surface Resistance

The electromagnetic wave reflection coefficient SC of the electromagnetic-wave-absorbing film 1 is represented by SC=(R−Z)/(R+Z), wherein R is the surface resistance (Ω/square) of the electromagnetic-wave-absorbing film 1, and Z is the characteristic impedance (Ω) of electromagnetic waves, which is 0 when R=Z. The characteristic impedance Z of electromagnetic waves changes drastically depending on the distance from an electromagnetic wave source at a position close to the electromagnetic wave source, and is equal to the characteristic impedance (377 Ω) of free space at a position sufficiently distant from the electromagnetic wave source. Accordingly, when the electromagnetic-wave-absorbing film 1 is positioned near the electromagnetic wave source, R is adjusted as close to Z as possible. When the electromagnetic-wave-absorbing film 1 is located at a position sufficiently distant from the electromagnetic wave source, R is made closer to the characteristic impedance of free space. The surface resistance of the electromagnetic-wave-absorbing film 11 can be adjusted by the material and thickness of the thin metal film 11, the widths, intervals and lengths of linear scratches 12, etc. The surface resistance can be measured by a DC two-terminal method.

(2) Second Electromagnetic-Wave-Absorbing Film

Figure 4A:
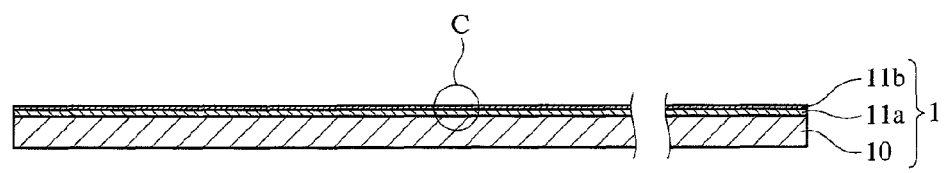
FIG. 4(a) is a cross-sectional view showing an electromagnetic-wave-absorbing film according to a still further embodiment of the present invention.
Figure 4B:
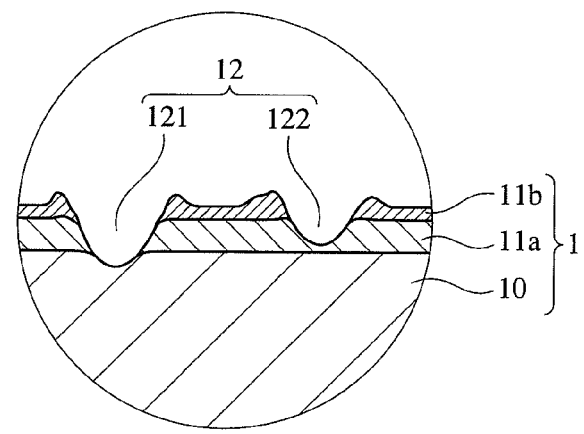
FIG. 4(b) is an enlarged cross-sectional view showing a portion C in FIG. 4(a).

FIGS. 4(a) and 4(b) show one example of the second electromagnetic-wave-absorbing films of the present invention. In this electromagnetic-wave-absorbing film, a thin, composite metal film constituted by thin films 11a, 11b made of first and second metals is formed on one surface of the plastic film 10, one of the first and second metals being a non-magnetic metal, and the other being a magnetic metal, and large numbers of substantially parallel, intermittent, linear scratches 12 are formed on an entire surface of the thin, composite metal film. The linear scratches 12 may be the same as shown in FIGS. 1(a)-1(d). The magnetic metal is nickel, cobalt, chromium or their alloys, and the non-magnetic metal is copper, silver, aluminum, tin or their alloys. A preferred combination is nickel and copper or aluminum. The thickness of the thin, magnetic metal film is preferably 0.01 μm or more, and the thickness of the thin, non-magnetic metal film is preferably 0.1 μm or more. Though not restrictive, the upper limit of the thickness may be practically about 10 μm for both thin metal films. More preferably, the thin, magnetic metal film is as thick as 0.01-5 μm, and the thin, non-magnetic metal film is as thick as 0.1-5 μm. Like the first electromagnetic-wave-absorbing film, the second electromagnetic-wave-absorbing film may have fine pores 13, a protective plastic layer 10a and embosses.

[2] Production Method of Electromagnetic-Wave-Absorbing Film

Any of the first and second electromagnetic-wave-absorbing films 1 can be produced by forming a thin metal film 11 on at least one surface of the plastic film 10 by a vapor deposition method (a physical vapor deposition method such as a vacuum deposition method, a sputtering method, an ion plating method, etc., or a chemical vapor deposition method such as a plasma CVD method, a thermal CVD method, an optical CVD method, etc.), a plating method or a foil-bonding method, bringing the resultant composite film on the side of the thin metal film 11 into sliding contact with a roll having large numbers of fine, high-hardness particles on the surface, to form large numbers of substantially parallel, intermittent, linear scratches 12 on the thin metal film 11.

(a) Formation of Linear Scratches

Figure 5A:
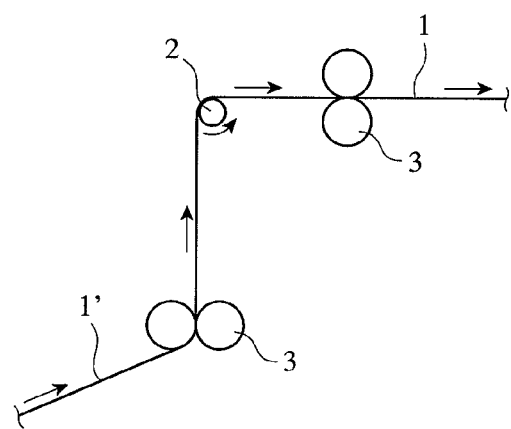
FIG. 5(a) is a schematic view showing one example of apparatuses for producing the electromagnetic-wave-absorbing film of the present invention.
Figure 5B:
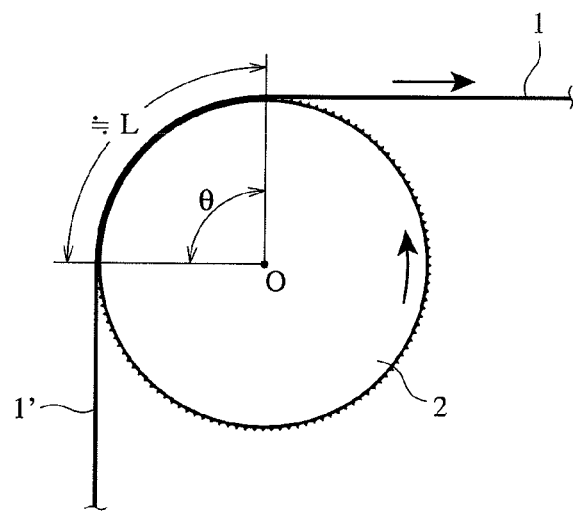
FIG. 5(b) is a partial, enlarged cross-sectional view showing the sliding contact of a composite film with a hard-particle roll in the apparatus of FIG. 5(a).

Linear scratches 12 can be formed, for example, by the method described in WO 2003/091003. As shown in FIGS. 5(a) and 5(b), a thin metal film 11 of a composite film 1' is preferably brought into sliding contact with a roll 2 having large numbers of fine, high-hardness (for example, Mohs hardness of 5 or more) particles with sharp edges (for example, fine diamond particles) adhered to the surface at random. The widths W, intervals I and lengths L of the linear scratches 12 are determined by the sliding conditions of the composite film 1' with the roll 2, such as the sizes of fine particles on the roll 2, the peripheral speeds of the composite film 1' and the roll 2, the tension of the composite film 1', the winding distance of the composite film 1' around the roll 2, the rotation directions of the composite film 1'and the roll 2, etc. Accordingly, 90% or more of fine particles have particle sizes in a range of preferably 1-1,000 μm, more preferably 10-100 μm. The fine particles are attached to a roll surface preferably at an area ratio of 50% or more. The peripheral speed of the composite film 1' is preferably 5-200 m/minute, and the peripheral speed of the roll 2 is preferably 10-2,000 m/minute. The tension of the composite film 1' is preferably 0.05-5 kgf/cm width. The winding distance L of the composite film 1' around the roll 2 (determined by a winding angle θ) corresponds to the lengths L of linear scratches 12. The rotation direction is preferably opposite between the roll 2 and the composite film 1'.

As shown in FIG. 5(b), when the fine particles of the roll 2 are brought into sliding contact with the thin metal film 11 of the composite film 1' under pressure, large numbers of substantially parallel, intermittent, linear scratches 12 are formed on the entire surface of the composite film 1' with irregular widths and intervals.

(b) Formation of Fine Pores, etc.

Large numbers of fine pores 13 can be formed on the thin metal film 11 having linear scratches 12 by the method described in Japanese Patent 2063411, etc. For example, the composite film 1' is caused to pass through a gap between a first roll having large numbers of fine particles with sharp edges and Mohs hardness of 5 or more adhered to the surface, which may be the same as the above linear-scratch-forming roll, and a second smooth roll pressed by the first roll, with the thin metal film 11 on the side of the first roll, at the same speed as the peripheral speed of the first roll. After forming linear scratches 12 and if necessary fine pores 13 on the composite film 1', a second plastic film may be bonded to the thin metal film 11 by a heat lamination method, etc., to form a protective plastic layer 10a. If necessary, the thin metal film 11 may be embossed.

[3] Electromagnetic Wave Absorber (1) First Electromagnetic Wave Absorber

The first electromagnetic wave absorber comprises pluralities of the above electromagnetic-wave-absorbing films arranged such that their linear scratches are oriented in different directions. Electromagnetic waves reflected or passed without being absorbed by one electromagnetic-wave-absorbing film are absorbed by another electromagnetic-wave-absorbing film, resulting in remarkably improved electromagnetic wave absorbability. Because the electromagnetic-wave-absorbing film has larger surface resistance in a direction perpendicular to the linear scratches 12 than in a direction parallel to the linear scratches 12, the electromagnetic-wave-absorbing film has anisotropy in electromagnetic wave absorbability. The anisotropy of electromagnetic wave absorbability can be suppressed by arranging pluralities of electromagnetic-wave-absorbing films such that their linear scratches 12 are oriented in different directions. When the electromagnetic wave absorber is constituted by two electromagnetic-wave-absorbing films, for example, they are preferably arranged such that their linear scratches 12 are substantially perpendicular to each other. When the electromagnetic wave absorber is constituted by three electromagnetic-wave-absorbing films, for example, they are preferably arranged such that their linear scratches 12 are crossing at 60°.

A combination of electromagnetic-wave-absorbing films may be any one of (1) a case where they are all the first electromagnetic-wave-absorbing films, (2) a case where they are all the second electromagnetic-wave-absorbing films, and (3) a case where they are the first and second electromagnetic-wave-absorbing films. A preferred example is a combination of a first electromagnetic-wave-absorbing film having a thin, magnetic metal film and a first electromagnetic-wave-absorbing film having a thin, non-magnetic metal film, the magnetic metal being nickel, and the non-magnetic metal being aluminum or copper.

When the first electromagnetic wave absorber is positioned near a electromagnetic wave source, a combination of an electromagnetic-wave-absorbing film having surface resistance of 20-377 Ω/square, preferably 30-377 Ω/square in a direction perpendicular to linear scratches 12, and an electromagnetic-wave-absorbing film having surface resistance of 377-10,000 Ω/square, preferably 377-7,000 Ω/square in a direction perpendicular to linear scratches 12 can efficiently absorb both electric field and magnetic field.

To achieve excellent electromagnetic wave absorbability, a dielectric layer (air layer) may exist between pluralities of electromagnetic-wave-absorbing films. In this case, a gap between the electromagnetic-wave-absorbing films is preferably 0.2-10 mm, more preferably 1-8 mm.

Figure 6:
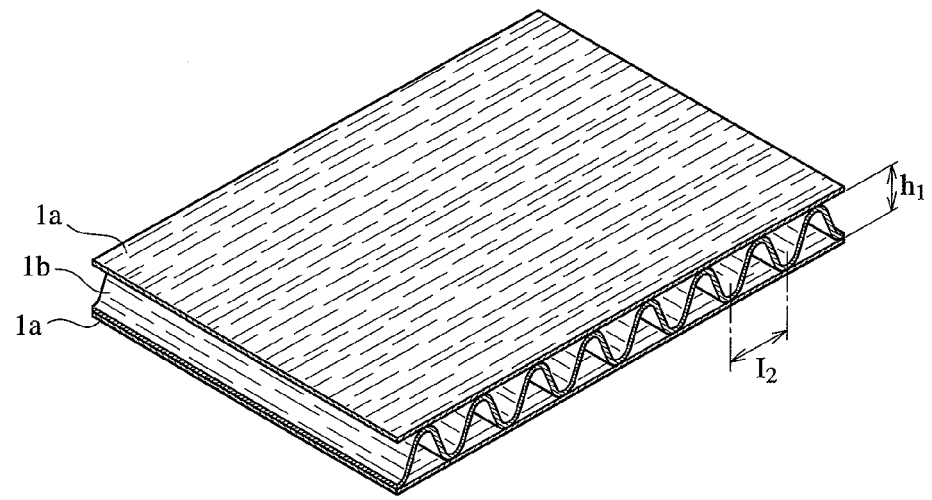
FIG. 6 is a perspective view showing an electromagnetic wave absorber according to one embodiment of the present invention.

FIG. 6 shows one example of electromagnetic wave absorbers comprising a corrugated electromagnetic-wave-absorbing film 1b between two, flat electromagnetic-wave-absorbing films 1a, 1a. The shape and size of the corrugated electromagnetic-wave-absorbing film 1b may properly be determined depending on its use. The corrugation may be constituted by sinusoids, continuously connected arches, continuously connected U shapes, etc. Because the flat electromagnetic-wave-absorbing films 1a, 1a are bonded to the corrugated electromagnetic-wave-absorbing film 1b along lines, this electromagnetic wave absorber has self-supportability, suitable for use in electronic apparatuses and communications apparatuses and buildings. The height $h_1$ and interval $I_2$ of the corrugation is preferably 0.2-3 mm when mounted in casings for electronic apparatuses and communications apparatuses, and 3-10 mm when mounted in inner walls of buildings for excellent heat insulation and sound absorption.

Figure 7:
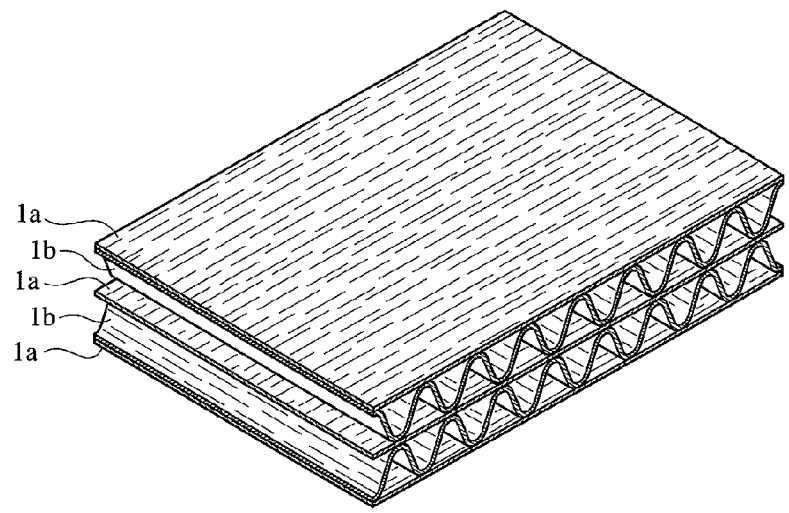
FIG. 7 is a perspective view showing an electromagnetic wave absorber according to another embodiment of the present invention.
Figure 8:
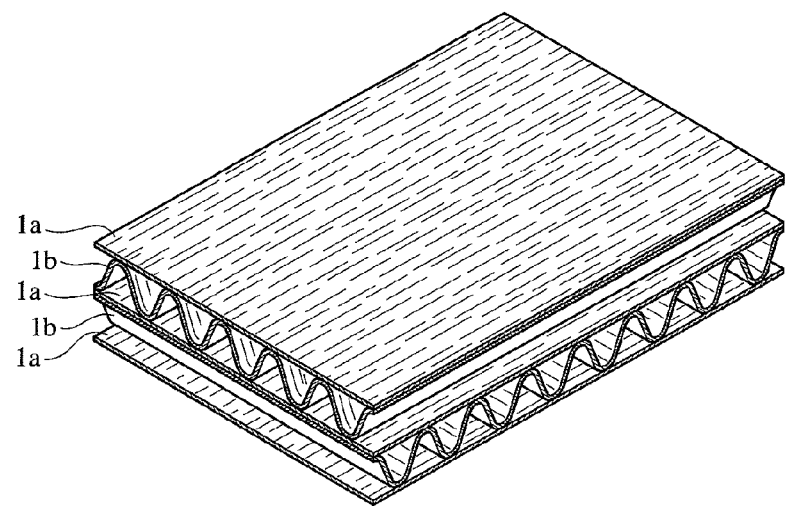
FIG. 8 is a perspective view showing an electromagnetic wave absorber according to a further embodiment of the present invention.
Figure 9:
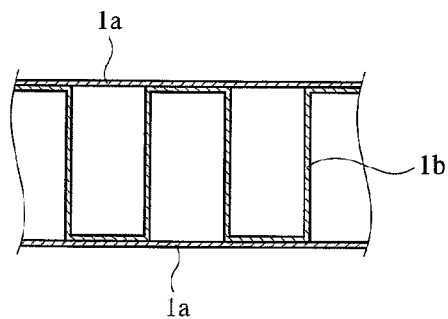
FIG. 9 is a cross-sectional view showing an electromagnetic wave absorber according to a still further embodiment of the present invention.
Figure 10:
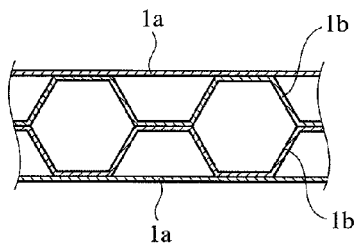
FIG. 10 is a cross-sectional view showing an electromagnetic wave absorber according to a still further embodiment of the present invention.

FIG. 7 shows one example of electromagnetic wave absorbers obtained by alternately laminating a flat electromagnetic-wave-absorbing film 1a and a corrugated electromagnetic-wave-absorbing film 1b. This electromagnetic wave absorber has higher self-supportability, heat insulation and sound absorption than those of the electromagnetic wave absorber of FIG. 6, suitable for inner walls in buildings. In this electromagnetic wave absorber, the electromagnetic-wave-absorbing films 1a, 1b are arranged such that their linear scratches are oriented alternately. As shown in FIG. 8, the corrugated electromagnetic-wave-absorbing films 1b, 1b may have different orientations. As shown in FIG. 9, the corrugated electromagnetic-wave-absorbing film 1b may have a cross section of U shapes. As shown in FIG. 10, pluralities of (for example, two) corrugated electromagnetic-wave-absorbing films 1b, 1b may be disposed between the two, flat electromagnetic-wave-absorbing films 1a, 1a.

Figure 11:
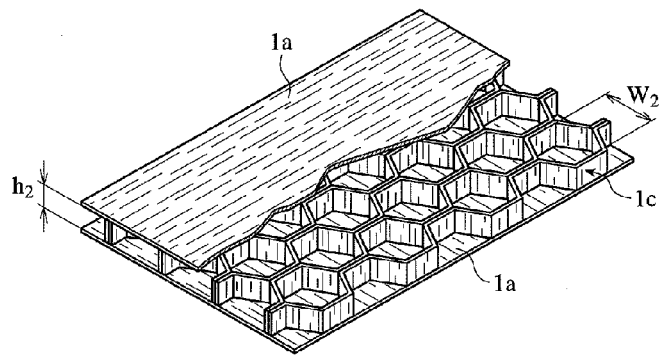
FIG. 11 is a partially broken perspective view showing an electromagnetic wave absorber according to a still further embodiment of the present invention.

In the electromagnetic wave absorber shown in FIG. 11, corrugated electromagnetic-wave-absorbing films 1c are arranged in a honeycomb structure between the flat electromagnetic-wave-absorbing films 1a, 1a, such that their linear scratches are substantially perpendicular to each other. This electromagnetic wave absorber has excellent heat insulation and sound absorption as well as high self-supportability, suitable for building materials, etc.

Figure 12A:
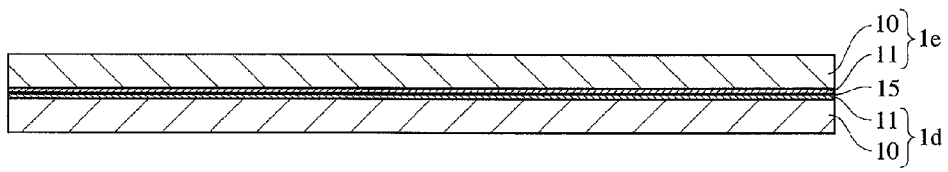
FIG. 12(a) is a cross-sectional view showing an electromagnetic wave absorber according to a still further embodiment of the present invention.
Figure 12B:
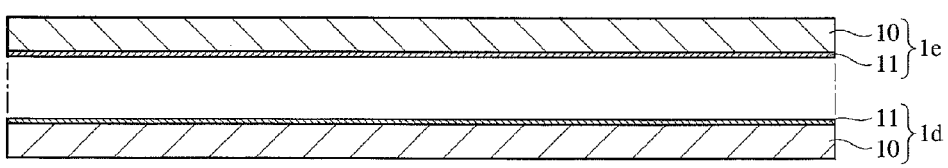
FIG. 12(b) is an exploded cross-sectional view of FIG. 12(a).

FIGS. 12(a) and 12(b) show an electromagnetic wave absorber having two electromagnetic-wave-absorbing films 1d, 1e, whose thin metal films 11, 11 are bonded to each other. 15 denotes a bonding layer. It is preferable that one of thin metal films 11, 11 in the electromagnetic-wave-absorbing films 1d, 1e is made of a non-magnetic metal, while the other is made of a magnetic metal.

In the examples shown in FIGS. 6-11, part of pluralities of flat electromagnetic-wave-absorbing films 1a may be substituted by a plastic film having a thin metal film formed on its entire surface.

(2) Second Electromagnetic Wave Absorber

Figure 13:
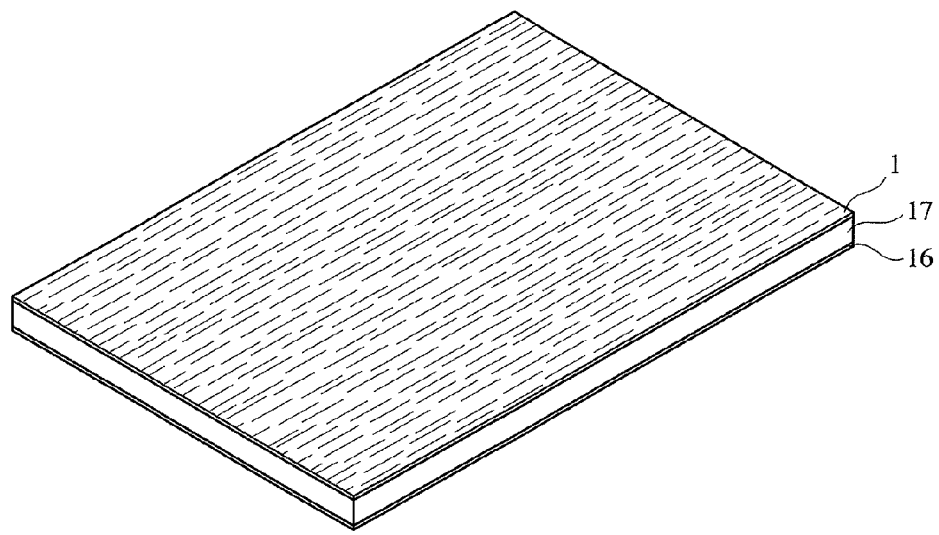
FIG. 13 is a perspective view showing an electromagnetic wave absorber according to a still further embodiment of the present invention.

FIG. 13 shows one example of the second electromagnetic wave absorbers. This electromagnetic wave absorber is obtained by laminating the electromagnetic-wave-absorbing film 1 and an electromagnetic wave reflector 16 via a dielectric layer 17. The electromagnetic-wave-absorbing film 1 is arranged on the side of the electromagnetic wave source. The electromagnetic wave reflector 16 is preferably a conductor such as a metal sheet or mesh, or a plastic film on which a thin metal film is formed. The dielectric layer 17 may be a dielectric body such as a plastic film, or an air layer. The thickness of the dielectric layer 17 is preferably in a range including ¼ of a center wavelength λ of electromagnetic waves to be absorbed, for instance, in a range from λ/8 to λ/2.

Figure 14:
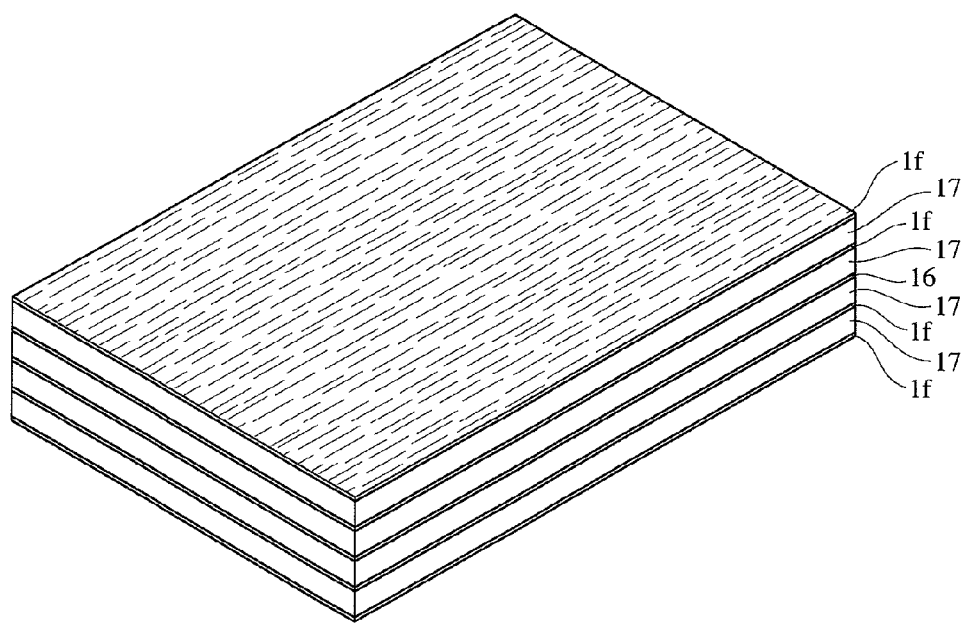
FIG. 14 is a perspective view showing an electromagnetic wave absorber according to a still further embodiment of the present invention.

FIG. 14 shows another example of the second electromagnetic wave absorbers. This electromagnetic wave absorber has a structure obtained by alternately laminating pluralities of electromagnetic-wave-absorbing films 1f and pluralities of dielectric layers 17, with an electromagnetic wave reflector 16 disposed as a center layer. The linear scratches of the electromagnetic-wave-absorbing films 1f are preferably oriented alternately in different directions (for example, in perpendicular directions).

In the electromagnetic wave absorber shown in FIGS. 6-11, part of pluralities of flat electromagnetic-wave-absorbing films 1a may be substituted by an electromagnetic wave reflector 16, with a dielectric layer 17 disposed between the electromagnetic-wave-absorbing film 1a and the electromagnetic wave reflector 16.

The present invention will be explained in more detail referring to Examples below without intention of restricting it thereto.

EXAMPLE 1

A 0.05-μm-thick aluminum layer was formed on a surface of a biaxially oriented polyethylene terephthalate (PET) film [thickness: 12 μm, dielectric constant: 3.2 (1 MHz), dissipation factor: 1.0% (1 MHz), melting point: 265° C., and glass transition temperature: 75° C.] by a vacuum deposition method, to produce a composite film. Using the apparatus shown in FIGS. 5(a) and 5(b), a roll 2 having electroplated fine diamond particles having a particle size distribution of 50-80 μm was brought into sliding contact with the aluminum layer of the composite film 1' under the following conditions.

Moving speed of composite film 1': 10 in/minute,
Peripheral speed of roll 2: 350 m/minute,
Tension of composite film 1': 0.1 kgf/cm width, and
Winding angle θ of film: 30°.

Optical photomicrographical observation revealed that the resultant electromagnetic-wave-absorbing film had the following linear scratches:

Range of widths W: 0.5-5 μm,
Average width Wav: 2 μm,
Range of intervals I: 2-10 μm,
Average interval Iav: 5 μm, and
Average length Lav: 5 mm.

Figure 15:
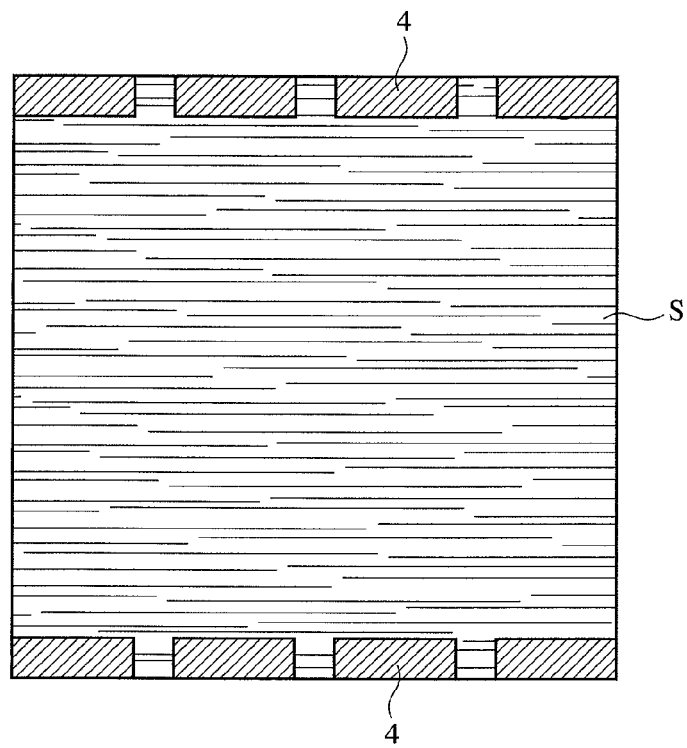
FIG. 15 is a plan view showing the arrangement of electrodes on a test piece of an electromagnetic-wave-absorbing film to measure its surface resistance.

As shown in FIG. 15, four pairs of copper electrodes (length 3 cm×width 1 cm) 4, 4 were arranged on opposing ends of a test piece (15 cm×15 cm) of the electromagnetic-wave-absorbing film, to measure resistance therebetween by a DC two-terminal method. The surface resistance of the electromagnetic-wave-absorbing film determined from its averaged resistance was 700 Ω/square and 10 Ω/square, respectively, in directions perpendicular and parallel to the linear scratches.

Figure 16:
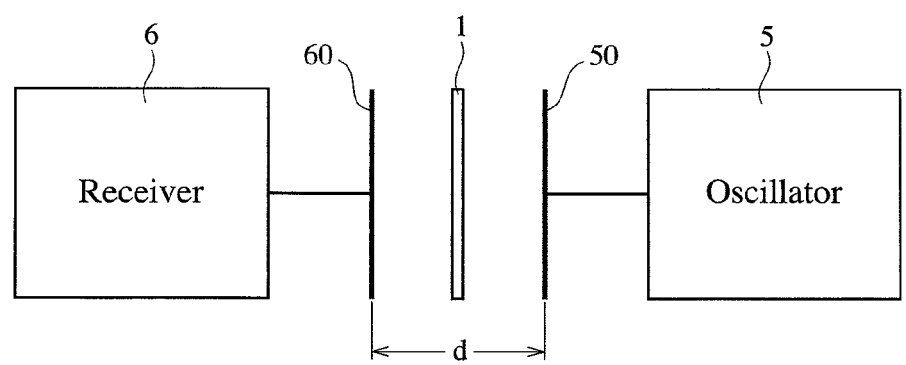
FIG. 16 is a schematic view showing an apparatus for evaluating the electromagnetic wave absorbability of an electromagnetic-wave-absorbing film.
Figure 17:
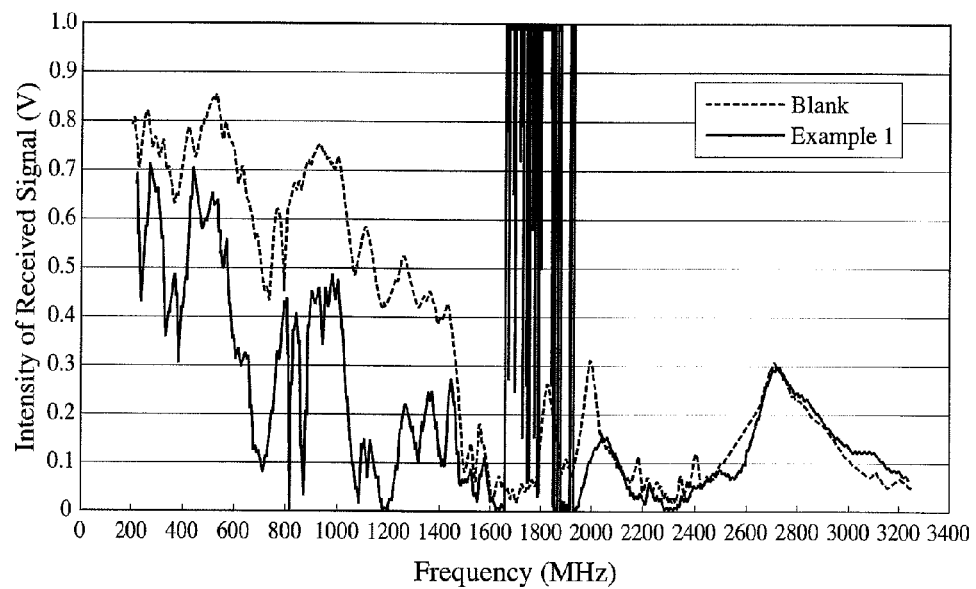
FIG. 17 is a graph showing the relation between the frequency and the intensity of a received signal in the electromagnetic-wave-absorbing film of Example 1.

As shown in FIG. 16, a high-frequency oscillator 5 comprising a transmitting antenna 50, and a high-frequency receiver 6 comprising a receiving antenna 60 were arranged such that the antennas 50, 60 were opposing with a distance d of 50 mm, and a test piece (15 cm×15 cm) of the electromagnetic-wave-absorbing film I was disposed between the antennas 50, 60. A signal having a frequency of 200-3,250 MHz and power of 2.5 mW was transmitted from the transmitting antenna 50 to measure the intensity of a received signal. The results are shown in FIG. 17. For comparison, the intensity of the received signal when the electromagnetic-wave-absorbing film 1 was not disposed between the antennas 50, 60 is shown by a dotted line (blank).

EXAMPLE 2

Figure 18:
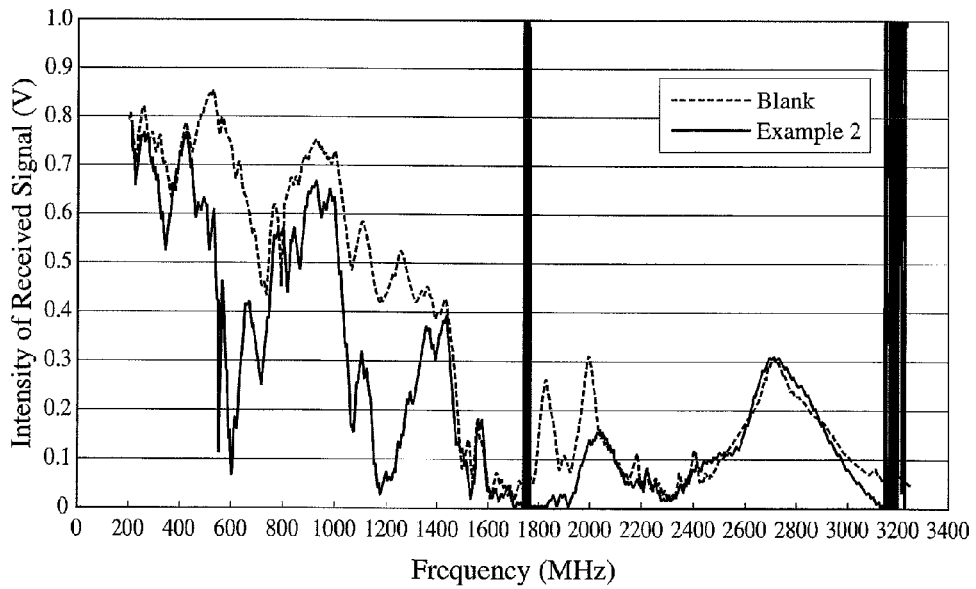
FIG. 18 is a graph showing the relation between the frequency and the intensity of a received signal in the electromagnetic-wave-absorbing film of Example 2.

The same electromagnetic-wave-absorbing film as in Example 1 except for having fine pores was produced. The fine pores had an average opening diameter of 3 μm, and an average density of 5×10$^4$/cm$^2$. The surface resistance of this electromagnetic-wave-absorbing film was 900 Ω/square and 15 Ω/square, respectively, in directions perpendicular and parallel to the linear scratches. The electromagnetic wave absorbability measured in the same manner as in Example 1 is shown in FIG. 18.

EXAMPLE 3

Figure 19:
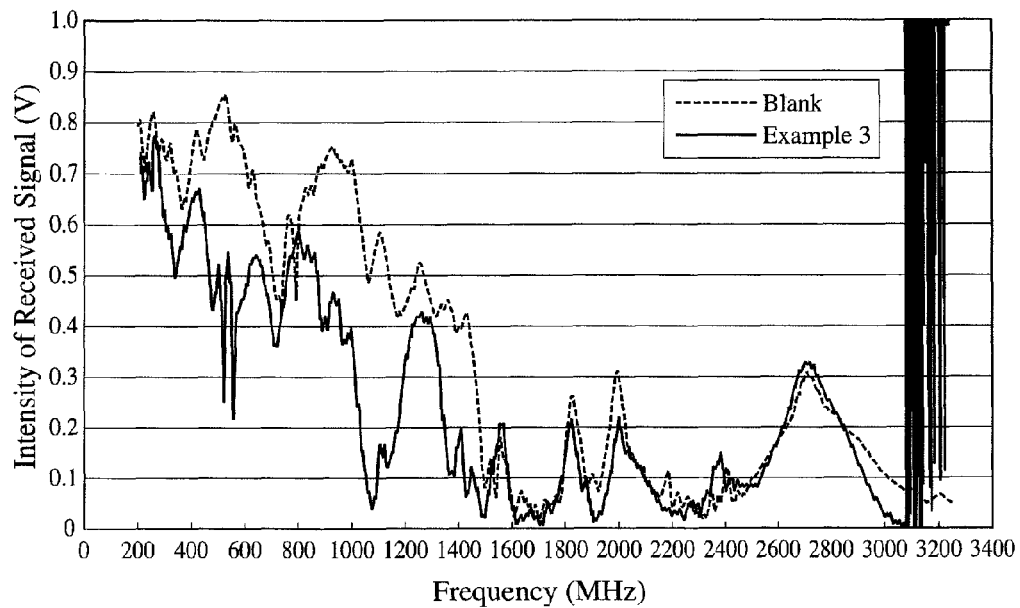
FIG. 19 is a graph showing the relation between the frequency and the intensity of a received signal in the electromagnetic wave absorber of Example 3.

An electromagnetic wave absorber was obtained by disposing the electromagnetic-wave-absorbing films of Examples 1 and 2 in parallel with a gap of 5.0 mm such that their linear scratches were substantially perpendicular to each other, and arranged between the antennas 50, 60 with the electromagnetic-wave-absorbing film of Example 1 on the side of the antenna 50, to evaluate the electromagnetic wave absorbability in the same manner as in Example 1. The results are shown in FIG. 19.

EXAMPLE 4

Figure 20:
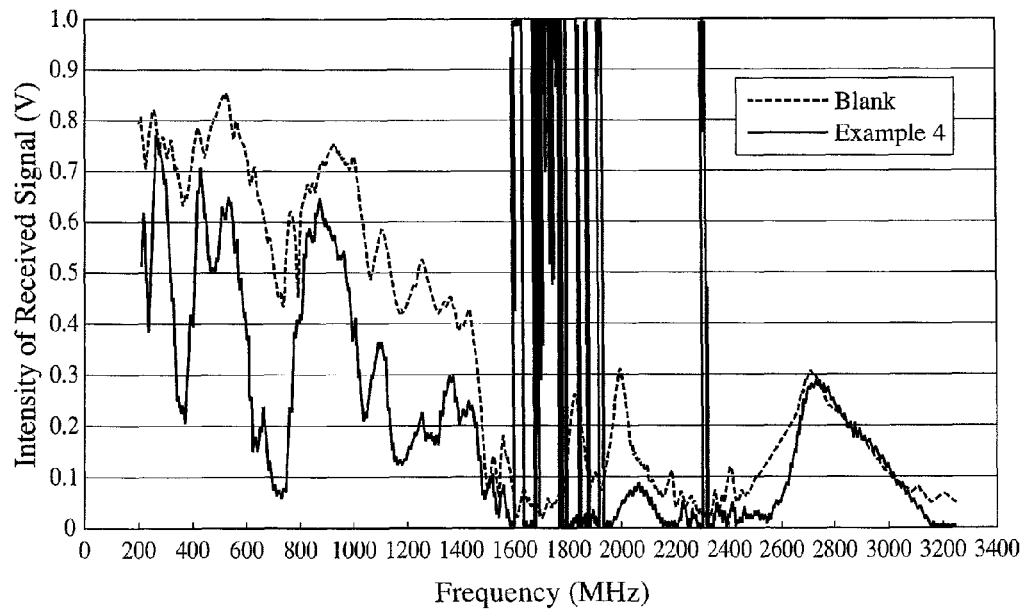
FIG. 20 is a graph showing the relation between the frequency and the intensity of a received signal in the of electromagnetic wave absorber of Example 4.

A flat electromagnetic-wave-absorbing film A having surface resistance of 200 Ω/square and 10 Ω/square, respectively, in directions perpendicular and parallel to the linear scratches was produced in the same manner as in Example 1 except for changing the peripheral speed of the roll to 200 m/minute, and an electromagnetic-wave-absorbing film B was produced by deforming the electromagnetic-wave-absorbing film of Example 1 to a sinusoidal shape (period: 5 mm, amplitude: 2.5 mm). These films were bonded such that their linear scratches were substantially perpendicular to each other, to produce the electromagnetic wave absorber shown in FIG. 8. The electromagnetic wave absorbability of this electromagnetic wave absorber is shown in FIG. 20.

EXAMPLE 5

Figure 21:
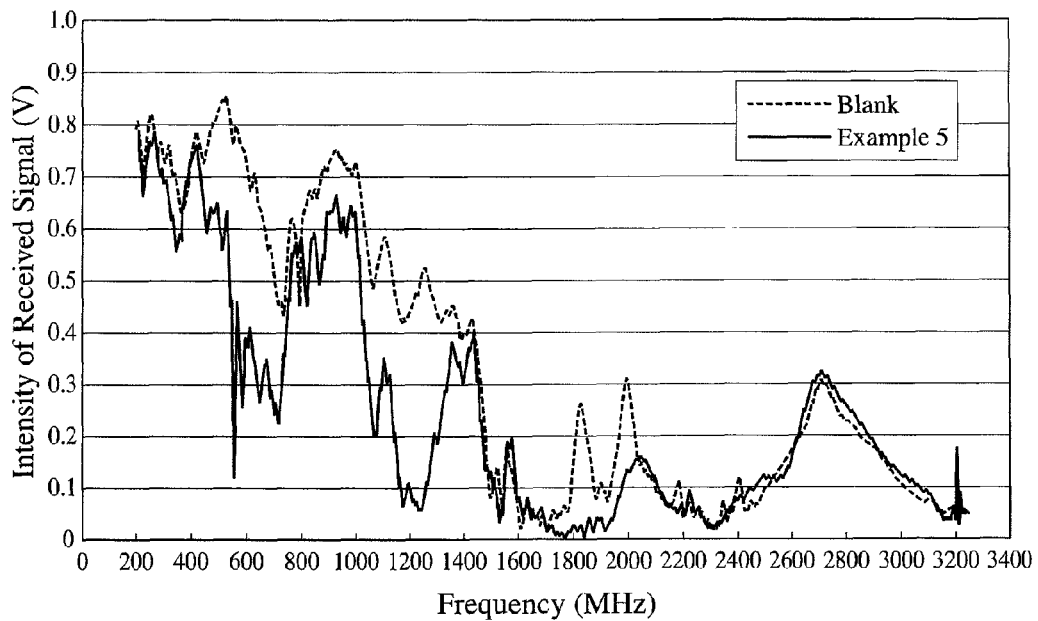
FIG. 21 is a graph showing the relation between the frequency and the intensity of a received signal in the electromagnetic-wave-absorbing film of Example 5.

An electromagnetic-wave-absorbing film was produced in the same manner as in Example 1, except for bonding a 20-μm-thick polybutylene terephthalate (PBT) film (melting point: 220° C., and glass transition temperature: 22° C.) to the aluminum layer by a heat lamination method. This electromagnetic-wave-absorbing film was provided with conical embosses on the PBT film side. The diameter, depth and area ratio of embosses were 200 μm, 200 μm and 40%, respectively. The electromagnetic wave absorbability of this electromagnetic-wave-absorbing film is shown in FIG. 21.

EXAMPLE 6

A 0.6-μm-thick copper layer and a 0.2-μm-thick nickel layer were formed on one surface of a 16-μm-thick, biaxially oriented PET film by a vacuum deposition method, and the resultant composite film was provided with linear scratches in the same manner as in Example 1 except for changing the peripheral speed of the roll 2 to 200 m/minute. The linear scratches and surface resistance of the resultant electromagnetic-wave-absorbing film are as follows:

Range of widths W: 0.5-5 μm,
Average width Wav: 2 μm,
Range of intervals I: 0.5-5 μm,
Average interval Iav: 2 μm,
Average length Lav: 5 mm,
Surface resistance: 150 Ω/square (perpendicular to linear scratches), and
5 Ω/square (parallel to linear scratches).

Figure 22:
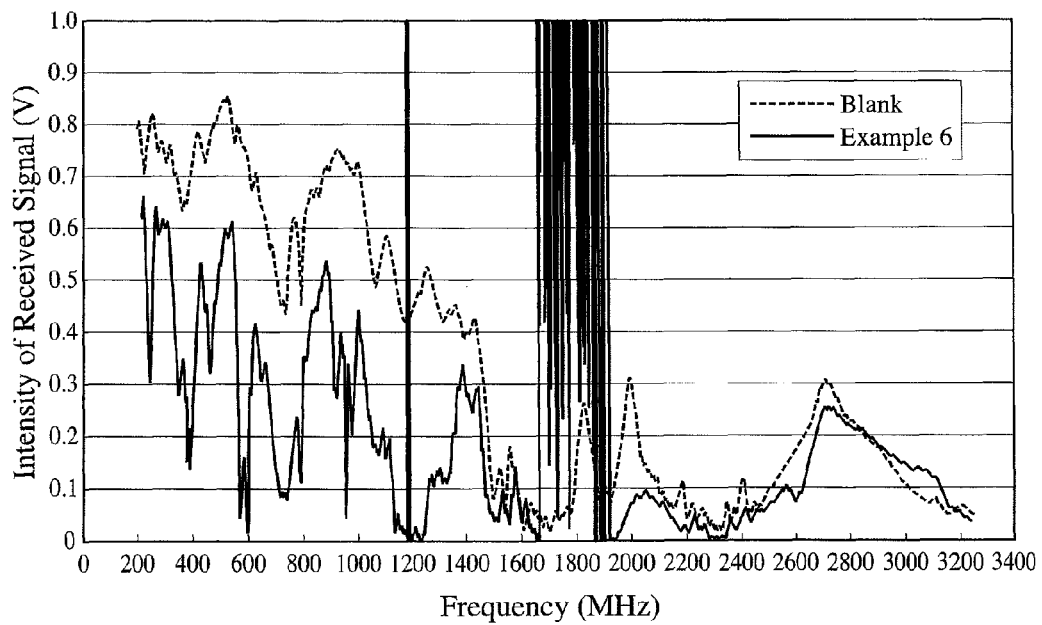
FIG. 22 is a graph showing the relation between the frequency and the intensity of a received signal in the electromagnetic-wave-absorbing film of Example 6.

The electromagnetic wave absorbability of this electromagnetic-wave-absorbing film is shown in FIG. 22.

EXAMPLE 7

Figure 23:
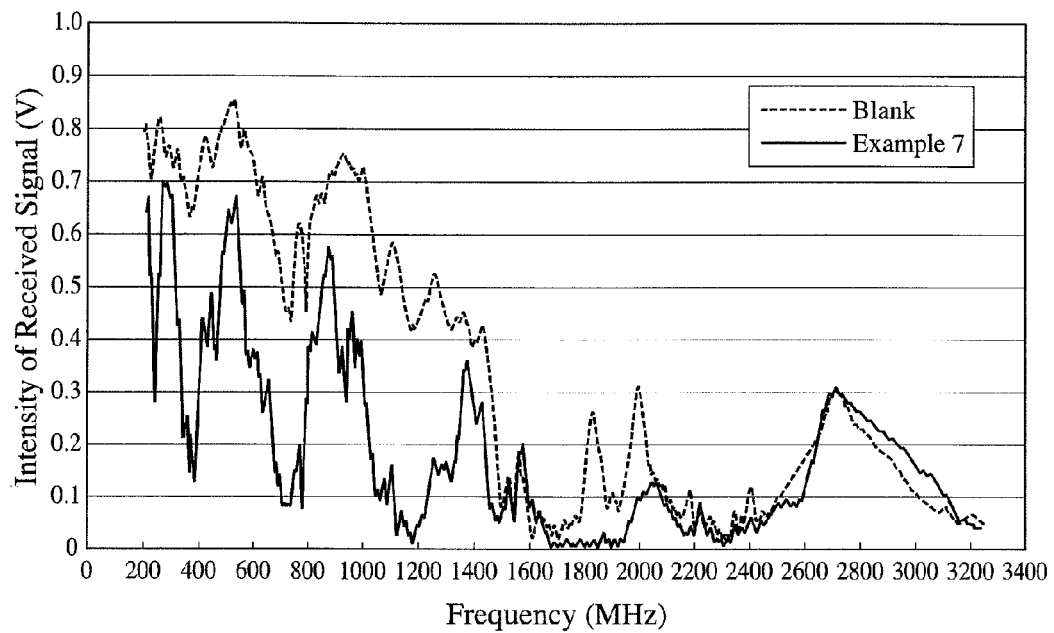
FIG. 23 is a graph showing the relation between the frequency and the intensity of a received signal in the electromagnetic-wave-absorbing film of Example 7.

An electromagnetic-wave-absorbing film was produced in the same manner as in Example 6, except that the nickel layer was as thick as 0.3 μm, and that the peripheral speed of the roll 2 was 300 m/minute. This electromagnetic-wave-absorbing film had surface resistance of 150 Ω/square and 10 Ω/square, respectively, in directions perpendicular and parallel to the linear scratches. The electromagnetic wave absorbability of this electromagnetic-wave-absorbing film is shown in FIG. 23.

As is clear from FIGS. 17-23, the electromagnetic-wave-absorbing films of Examples 1-7 had excellent absorbability to electromagnetic waves in a range of 200-1,600 MHz, particularly in ranges of 550-800 MHz and 1,000-1,400 MHz.

Effect of the Invention

Because the electromagnetic-wave-absorbing film of the present invention is provided with large numbers of linear scratches with irregular widths and intervals on a thin metal film, it has excellent absorbability of electromagnetic waves in a wide frequency range. Also, in the electromagnetic wave absorber of the present invention obtained by combining pluralities of electromagnetic-wave-absorbing films, electromagnetic waves reflected by or passing through one electromagnetic-wave-absorbing film are absorbed by another electromagnetic-wave-absorbing film, resulting in high electromagnetic wave absorbability. Particularly, the electromagnetic wave absorber obtained by arranging pluralities of electromagnetic-wave-absorbing films with different orientations of linear scratches is advantageous in suppressing the anisotropy of electromagnetic wave absorption. Further, the electromagnetic wave absorber obtained by arranging pluralities of electromagnetic-wave-absorbing films via a space has excellent heat insulation and sound absorption in addition to electromagnetic wave absorbability, suitable for building materials. The electromagnetic-wave-absorbing film of the present invention having such features can be produced inexpensively by using a roll having fine, hard particles on the surface.

Such electromagnetic-wave-absorbing films and electromagnetic wave absorbers of the present invention are suitable for electronic and communications apparatuses such as cell phones, personal computers, television sets, etc., and inner walls of buildings, etc. Particularly the electromagnetic wave absorbers obtained by bonding at least one flat electromagnetic-wave-absorbing film and at least one corrugated electromagnetic-wave-absorbing film have high electromagnetic wave absorbability, and excellent heat insulation, sound absorption and self-supportability, suitable as electromagnetic wave shields for inner walls of buildings.

What is claimed is:

1. An electromagnetic-wave-absorbing film comprising a plastic film, and a single- or multi-layer, thin metal film formed on at least one surface of said plastic film, said thin metal film being provided with large numbers of substantially parallel, intermittent, linear scratches with irregular widths and irregular intervals, said linear scratches having widths, 90% or more of which are in a range of 0.1-1,000 μm, an average width of 1-100 μm, intervals in a range of 0.1 μm to 5 mm, and an average interval of 1-100 μm.

2. The electromagnetic-wave-absorbing film according to claim 1, wherein said thin metal film is made of aluminum, copper, nickel or their alloys.

3. The electromagnetic-wave-absorbing film according to claim 1, wherein said linear scratches are formed by sliding contact with a roll having large numbers of fine, high-hardness particles with sharp edges adhered to the surface at random.

4. The electromagnetic-wave-absorbing film according to claim 1, wherein said thin metal film further has large numbers of fine pores.

5. An electromagnetic wave absorber comprising pluralities of electromagnetic-wave-absorbing films, each of which comprises a plastic film and a single- or multi-layer, thin metal film formed on at least one surface of said plastic film, said thin metal film being provided with large numbers of substantially parallel, intermittent, linear scratches with irregular widths and intervals, and pluralities of said electromagnetic-wave-absorbing films being arranged such that their linear scratches are oriented in different directions.

6. The electromagnetic wave absorber according to claim 5, wherein at least one of said electromagnetic-wave-absorbing films is a corrugated electromagnetic-wave-absorbing film.

7. The electromagnetic wave absorber according to claim 6, which comprises a pair of outermost, flat, electromagnetic-wave-absorbing films, and at least one corrugated, electromagnetic-wave-absorbing film sandwiched by said flat electromagnetic-wave-absorbing films, adjacent electromagnetic-wave-absorbing films being arranged such that their linear scratches are substantially perpendicular to each other, and that their contactareas are bonded to each other, thereby having reduced anisotropy of electromagnetic wave absorbability and self-supportability.

8. An electromagnetic wave absorber comprising at least one electromagnetic-wave-absorbing film and an electromagnetic wave reflector arranged via a dielectric layer, said electromagnetic-wave-absorbing film comprising a plastic film and a single- or multi-layer, thin metal film formed on at least one surface of said plastic film, and said thin metal film being provided with large numbers of substantially parallel, intermittent, linear scratches with irregular widths and intervals.

9. The electromagnetic wave absorber according to claim 8, wherein said electromagnetic wave reflector layer is a metal foil or plastic film having a thin metal film.

* * * * *